US 9,853,632 B2

(12) United States Patent
Hu et al.

(10) Patent No.: US 9,853,632 B2
(45) Date of Patent: Dec. 26, 2017

(54) SIGNAL DRIVER SLEW RATE CONTROL

(71) Applicant: Integrated Device Technology, Inc., San Jose, CA (US)

(72) Inventors: Zhigang Hu, Shanghai (CN); Hui Yu, Shanghai (CN); Shaokang Wang, Shanghai (CN); Yuan Zhang, Shanghai (CN); Yue Yu, Johns Creek, GA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/000,214

(22) Filed: Jan. 19, 2016

(65) Prior Publication Data

US 2017/0201243 A1 Jul. 13, 2017

(30) Foreign Application Priority Data

Jan. 12, 2016 (CN) .......................... 2016 1 0016355

(51) Int. Cl.
*H03K 5/04* (2006.01)
*H03K 7/08* (2006.01)
*H03K 5/15* (2006.01)
*G11C 7/10* (2006.01)

(52) U.S. Cl.
CPC ............. *H03K 5/15* (2013.01); *G11C 7/1057* (2013.01)

(58) Field of Classification Search
CPC .. H03K 5/15; H03K 5/15026; H03K 5/15033; H03K 5/1504; H03K 5/15046; H03K 5/15053

USPC ........ 327/170, 172, 261, 269–271, 276–278, 327/284, 285
See application file for complete search history.

(56) References Cited

U.S. PATENT DOCUMENTS

| 6,288,563 B1* | 9/2001 | Muljono .......... H03K 19/01858 326/27 |
| 7,298,173 B1* | 11/2007 | Jiang ........................ H03K 5/06 326/82 |
| 8,902,638 B2* | 12/2014 | Wang ....................... G11C 11/40 365/149 |

OTHER PUBLICATIONS

Ker, Ming-Dou, et al., "Design on Mixed-Voltage I/O Buffers with Slew-Rate Control in Low-Voltage CMOS Process," 2008 IEEE, pp. 1047-1050.
Shin, Soon-Kyun et al., A Slew-Rate Controlled Output Driver Using PLL as Compensation Circuit; 2003 IEEE, pp. 1227-1233.
Dabral, Sanjay et al., "Basic ESD and I/O Design", John Wile7 & Sons, 1998, 4 pages of book.

* cited by examiner

*Primary Examiner* — Lincoln Donovan
*Assistant Examiner* — Diana J Cheng
(74) *Attorney, Agent, or Firm* — Christopher P. Maiorana, PC

(57) ABSTRACT

An apparatus includes a first circuit and a second circuit. The first circuit may be configured to (i) generate a plurality of delayed signals each as a copy of an input signal shifted in time by a sequence of respective delays based on a control signal and (ii) change a number of driver signals that are active during each delay in the sequence of respective delays based on the input signal and the plurality of delayed signals to control a slew rate of an output signal. The second circuit may be configured to drive the output signal in response to the driver signals.

18 Claims, 11 Drawing Sheets

SIGNAL DRIVER SLEW RATE CONTROL

This application relates to Chinese Application No. 201610016355.9, filed Jan. 12, 2016, which is hereby incorporated by reference in its entirety.

FIELD OF THE INVENTION

The invention relates to memory generally and, more particularly, to a method and/or apparatus for implementing signal driver slew rate control.

BACKGROUND OF THE INVENTION

Random access memory (RAM) provides fast, cost-effective, volatile storage for computing devices. The Joint Electron Device Engineering Council (JEDEC) provides memory standards for storage devices. DDR4 SDRAM (double data rate fourth generation synchronous dynamic random-access memory) provides higher module density, lower voltage specifications and higher data rate transfer speeds. DDR4 LRDIMM (load reduced dual in-line memory module) technology uses a distributed buffer approach to implement memory bandwidth efficiencies when scaling to higher capacities and data rate transfer speeds.

With the advancement of DDR memory interfaces, the DDR4 memory currently operates at a data rate up to 3.2 gigabits per second. At such data rates, integrity and timing become more challenging and difficult. As speed goes higher, drivers switch more often, rising/falling edges become sharper and larger switching currents are introduced. Switching currents contribute to power consumption, and introduce power noise that causes jitter, duty cycle degradation through power wire parasitic resistor and package/printed circuit board parasitic inductors.

It would be desirable to implement signal driver slew rate control.

SUMMARY OF THE INVENTION

The invention concerns an apparatus having a first circuit and a second circuit. The first circuit may be configured to (i) generate a plurality of delayed signals each as a copy of an input signal shifted in time by a sequence of respective delays based on a control signal and (ii) change a number of driver signals that are active during each delay in the sequence of respective delays based on the input signal and the plurality of delayed signals to control a slew rate of an output signal. The second circuit may be configured to drive the output signal in response to the driver signals.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the invention include providing a method and/or apparatus for signal driver slew rate control that may (i) be insensitive to fabrication process parameters, (ii) consume low power, (iii) improve signal integrity, (iv) provide a selection among different slew rates according to loading criteria, (v) provide slew rate trimming and/or (vi) be implemented within an integrated circuit.

Various embodiments of the invention may provide a low power, slew rate controlled driver of output signals. Some embodiments may provide slew rate insensitive delay for DDR4 memory interfaces. Low power is generally realized by reducing driver switching currents. To achieve improved signal integrity performance, different slew rate values may be chosen according to different DIMM loading after slew rate trimming. The slew rate trimming generally makes the slew rate insensitive to the fabrication process of the driver circuit. A result may be reduced reflections due to slower slew rates and reduced inter-symbol interferences.

Figure 1:
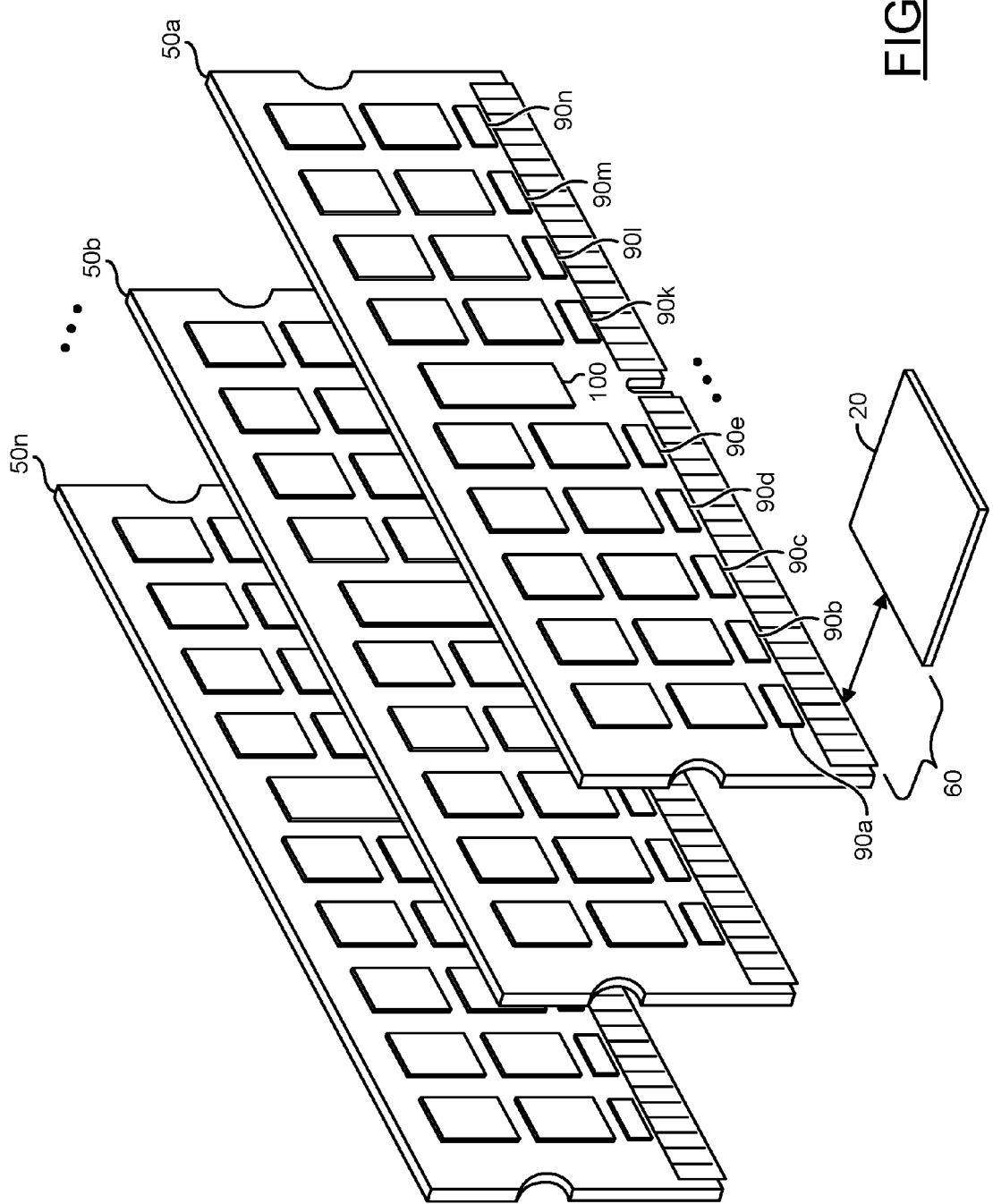
FIG. 1 is a diagram illustrating an example embodiment.

Referring to FIG. 1, a diagram illustrating a number of example circuits 50a-50n are shown. In an example, circuits 50a-50n may be implemented as memory modules (or boards). For example, the memory modules 50a-50n may be implemented as double data rate fourth generation (DDR4) synchronous dynamic random-access memory (SDRAM) modules. The memory modules 50a-50n may comprise a number of blocks (or circuits) 90a-90n, a block (or circuit) 100, and/or various other blocks, circuits, pins, connectors and/or traces. The circuits 90a-90n may be configured as data buffers. The circuit 100 may be implemented as a registered clock driver (RCD). In an example, the RCD circuit 100 may be implemented as a DDR4 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may be a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may be DDR4 SDRAM memory modules. The DDR4 SDRAM memory modules 50a-50n may have a memory module density of 512 gigabyte (GB), terabyte, or higher per module (e.g., compared to 128 GB per dual in-line memory module (DIMM) in DDR3). The DDR4 SDRAM memory modules 50a-50n may operate at voltages of 1.2-1.35 volts (V) with a frequency between 800-2133 megahertz (MHZ) (e.g., compared to 1.5-1.65V at frequencies between 400-1067 MHz in DDR3). In some embodiments, the memory modules 50a-50n may be implemented as low voltage DDR4 and operate at 1.05V. For example, the DDR4 SDRAM memory modules 50a-50n may implement 35% power savings compared to DDR3 memory. The DDR4 SDRAM memory modules 50a-50n may transfer data at speeds of 2.13-4.26 giga-transfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM) or DDR4 registered DIMM (RDIMM). The data buffers 90a-90n may allow the memory modules 50a-50n in a DDR4 LRDIMM configuration to operate at higher bandwidth and/or at higher capacities compared to DDR4 RDIMM (e.g., 1333 MT/s for DDR4 LRDIMM compared to 1067 MT/s for DDR4 RDIMM at 384 GB capacity). For example, compared to DDR4 RDIMM configurations, the DDR4 LRDIMM configuration of the memory modules 50a-50n may allow improved signal integrity on data signals, lower component latency through the data buffers 90a-90n and/or better intelligence and/or post-buffer awareness by the memory controller 20.

Figure 2:
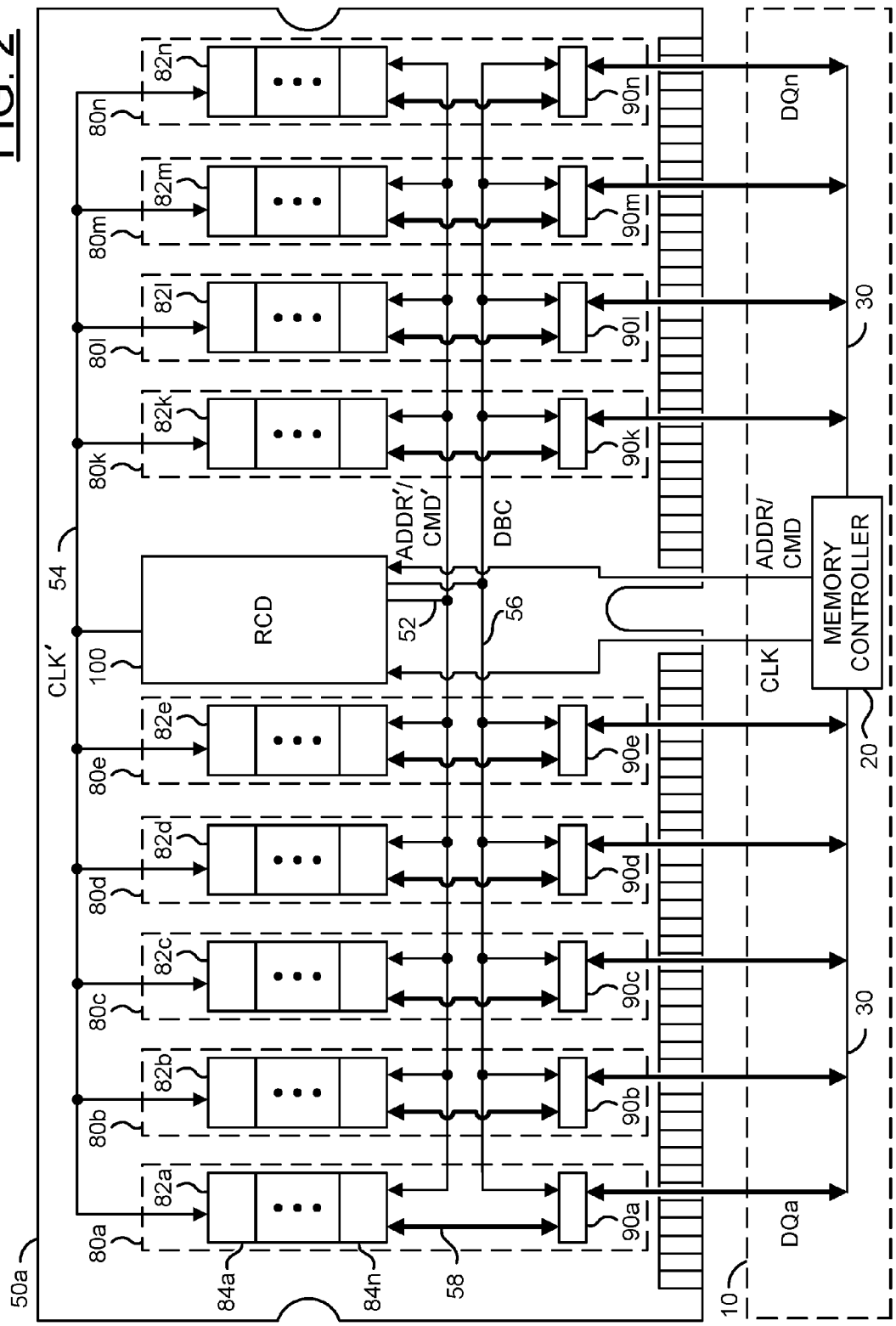
FIG. 2 is a block diagram illustrating a memory module.

Referring to FIG. 2, a block diagram 50a illustrating a memory module is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 100. The circuits 80a-80n may implement data paths of the memory module 50a. For example, the data path 80a may include the blocks 82a and/or the data buffer 90a. The data paths 80b-80n may have a similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 100. A data bus 30 may be connected between the memory controller 20 and the data paths 80a-80n. The memory controller 20 may generate and/or receive data signals (e.g., DQa-DQn) that may be presented/received from the data bus 30. The signals DQa-DQn may be presented to each of the data paths 80a-80n.

The RCD circuit 100 may be configured to communicate with the memory controller 20, the memory channels 82a-82n and/or the data buffers 90a-90n. The RCD circuit 100 may decode instructions received from the memory controller 20. For example, the RCD circuit 100 may receive register command words (RCWs). In another example, the RCD circuit 100 may receive buffer control words (BCWs). The RCD circuit 100 may be configured to train the DRAM chips 84a-84n, the data buffers 90a-90n and/or command and address lines between the memory controller 20. For example, the RCWs may flow from the memory controller 20 to the RCD circuit 100. The RCWs may be used to configure the RCD circuit 100.

The RCD circuit 100 may be used in both LRDIMM and RDIMM configurations. The RCD circuit 100 may implement a 32-bit 1:2 command/address register. The RCD circuit 100 may support an at-speed bus (e.g., a BCOM bus between the RCD circuit 100 and the data buffers 90a-90n). The RCD circuit 100 may implement automatic impedance calibration. The RCD circuit 100 may implement command/address parity checking. The RCD circuit 100 may control register RCW readback. The RCD circuit 100 may implement a 1 MHz inter-integrated circuit ($I^2C$) bus (e.g., a serial bus). Inputs to the RCD circuit 100 may be pseudo-differential using external and/or internal voltages. The clock outputs, command/address outputs, control outputs and/or data buffer control outputs of the RCD circuit 100 may be enabled in groups and independently driven with different strengths.

The RCD circuit 100 may receive the signal CLK and/or the signals ADDR/CMD from the memory controller 20. Various digital logic components of the RCD circuit 100 may be used to generate signals based on the signal CLK and/or the signals ADDR/CMD and/or other signals (e.g., RCWs). The RCD circuit 100 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 100 may generate one or more signals (e.g., DBC). The signals DBC may be presented to the data buffers 90a-90n. The signals DBC may be transmitted on a common bus 56 (e.g., a data buffer control bus).

The data buffers 90a-90n may be configured to receive data from the bus 56. The data buffers 90a-90n may be configured to generate/receive data to/from the bus 30. The bus 30 may comprise traces, pins and/or connections between the memory controller 20 and the data buffers 90a-90n. A bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82a-82n to the memory controller 20).

The data buffers 90a-90n may exchange data with the DRAM chips 84a-84n in small units (e.g., 4-bit nibbles). In various embodiments, the DRAM chips 84a-84n may be arranged in multiple (e.g., two) sets. For two set/two DRAM chip 84a-84b implementations, each set may contain a single DRAM chips 84a-84n. Each DRAM chip 84A-84b may be connected to the respective data buffers 90a-90n through an upper nibble and a lower nibble. For two set/four DRAM chip 84a-84d implementations, each set may contain two DRAM chips 84a-84d. A set may be connected to the respective data buffers 90a-90n through the upper nibble. The other set may be connected to the respective data buffers 90a-90n through the lower nibble. For two set/eight DRAM chip 84a-84h implementations, each set may contain four of the DRAM chips 84a-84h. A set of four DRAM chips 84a-84d may connect to the respective data buffers 90a-90n through the upper nibble. The other set of four DRAM chips 84e-84h may connect to the respective data buffers 90a-90n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 90a-90n may allow DDR4 LRDIMM designs to implement shorter I/O trace lengths compared to DDR3 LRDIMM designs, that use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), that is 50% less latency than DDR3 buffer memory). In yet another example, the shorter traces may reduce I/O bus turnaround time. For example, without the distributed data buffers 90a-90n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 90a-90n. The memory modules 50a-50n may implement 2 millimeter (mm) frontside bus traces and backside traces (e.g., the connectors/pins/traces 60). A propagation delay through the data buffers 90a-90n may be 33% faster than through a DDR3 memory buffer (e.g., resulting in reduced latency). In some embodiments, the data buffers 90a-90n may be smaller (e.g., a reduced area parameter) than a data buffer used for DDR3 applications.

Figure 3:
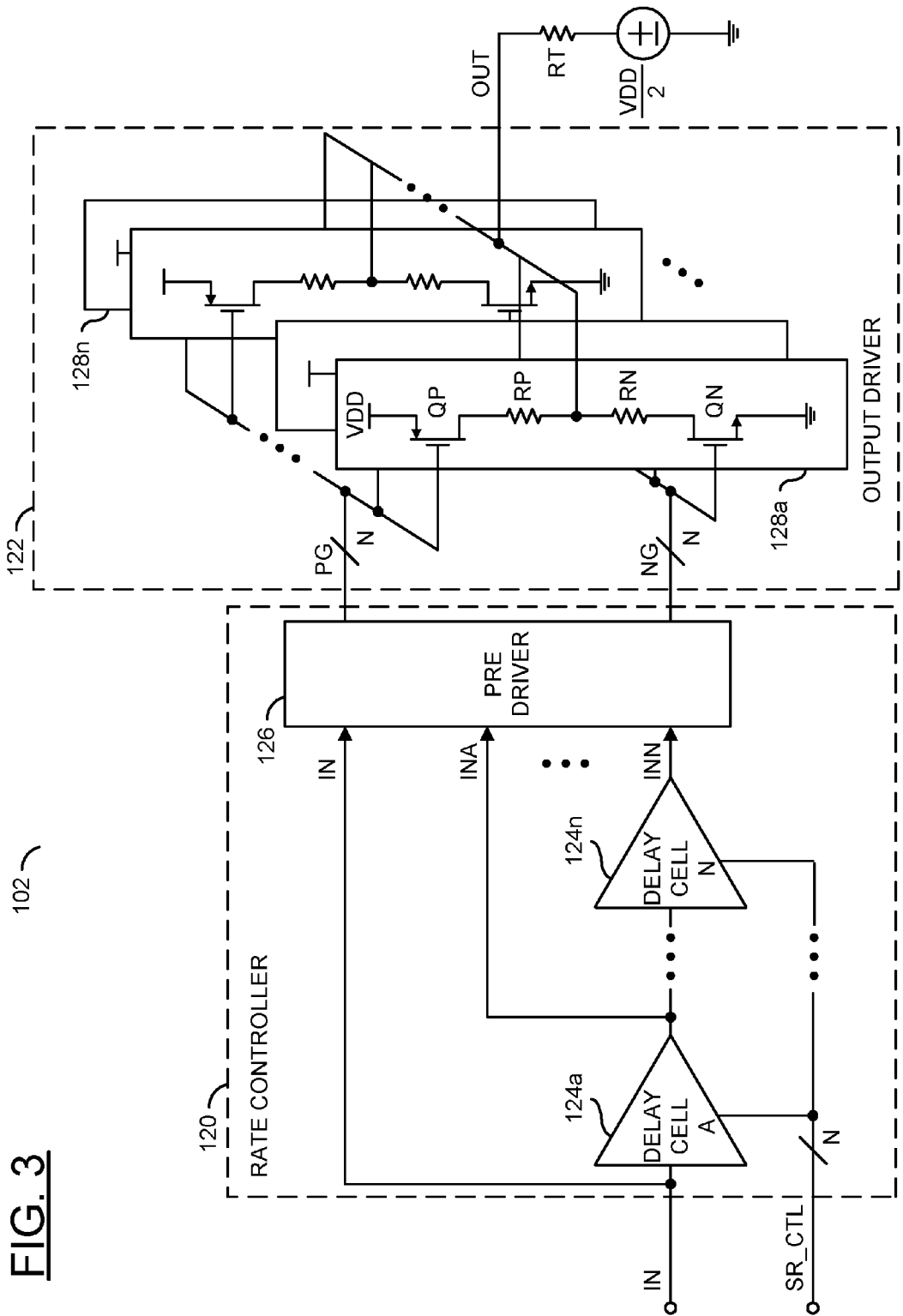
FIG. 3 is a block diagram of a driver circuit.

Referring to FIG. 3, a block diagram of an example implementation of a driver portion (or circuit) 102 of the RCD circuit 100 is shown. The driver circuit 102 generally comprises a rate controller block (or circuit) 120 and an output driver block (or circuit) 122. The rate controller circuit 120 may include multiple delay cell blocks (or circuits) 124a-124n and a pre-driver block (or circuit) 126. The output driver circuit 122 generally comprises multiple buffer blocks (or circuits) 128a-128n. Each buffer circuit 128a-128n may include a pull up transistor QP connected to an output node through a pull up resistor RP and a pull down transistor QN connected to the output node through a pull down resistor RN. The output nodes of the buffer circuits 128a-128n may be joined. A termination resistor RT may by coupled at one end to the circuit 122 (the output nodes of the buffer circuits 128a-128n). Another end of the termination resistor RT may be biased to approximately half a positive power supply voltage (e.g., VDD).

An input signal (e.g., IN) may be received by an initial driver cell 124a and the pre-driver circuit 126. The signal IN may represent any of the command signal CMD, the address signal ADDR and/or other information signals transferred from the memory controller 20 to the RCD circuit 100. A slew rate control signal (e.g., SR_CTL) may be received by each of the delay cells 124a-124n. The control signal SR_CTL may carry a multi-bit digital signal that controls a delay through each delay cell 124a-124n within a range of delay durations. An output signal (e.g., OUT) may be generated by the output driver circuit 122. The signal OUT is generally a combination of output signals generated by each buffer circuit 128a-128n operating in parallel.

The delay cells 124a-124n may be connected in series. Each delay cell 124a-124n may generate an internal delayed signal (e.g., INA-INN). The delayed signal INA may be a copy of the input signal IN shifted in time by an amount determined by the control signal SR_CTL. Each subsequent delayed signal INB-INN may be a copy of the previous delayed signal INA-INM shifted in time by an amount determined by the control signal SR_CTL. The signals IN, and INA to INN may be received by the pre-driver circuit 126.

The pre-driver circuit 126 may be configured to generate a multi-part (e.g., N-part) positive (or pull up) gate driver signal (e.g., PG) and a multi-part (e.g., N-part) negative (or pull down) gate driver signal (e.g., NG). The individual parts (or components) of the gate driver signals PG and NG may be received by respective gates of the transistors QP and QN in the buffer circuits 128a-128n. A number of components may be active at any given time and a remainder of components may be inactive at the given time.

Each delay cell 124a-124n may be operational to delay a signal received at a respective input port to present a delayed signal at a respective output port. A delay (or interval) through each delay cell 124a-124n may be programmed by the control signal SR_CTL. In various embodiments, the programming may be applied to the delay cells 124a-124n individually, to some delay cells 124a-124n and/or to all delay cells 124a-124n concurrently.

The pre-driver circuit 126 may be operational to generate the gate driver signals PG and NG based on the signals IN and INA-INN. The pre-driver circuit 126 may trigger on the rising edges and/or fall edges of the signal IN and INA-INN. The individual gate driver signals PG (e.g., PG<A> to PG<N>) and NG (e.g., NG<A> to NG<N>) may be switched individually and/or in groups.

Each buffer circuit 128a-128n may be operational to drive the signal OUT based on the respective components of the gate driver signals PG and NG. The transistors QP may be connected to the positive power supply voltage VDD. The transistors QN may be connected to a ground voltage (or negative power supply voltage VSS). In various embodiments, the transistors QN may be implemented as n-channel metal oxide semiconductor (NMOS) transistors. The transistors QP may be implemented as p-channel metal oxide semiconductor (PMOS) transistors. Other transistor types may be implemented to meet the design criteria of a particular application.

The programmable delay cells 124a-124n may generate the delayed signals INA-INN, respectively. The pre-driver circuit 126 may switch one or more groups of the gate driver signals PG and NG based on edges (rising and falling) in the signals IN and INA-INN. The buffer circuits 128a-128n in the output driver circuit 122 may be separately controlled by respective components in the gate driver signals PG and NG to avoid or reduce having both the pull down transistors QN and the pull up transistors QP active (or on or conducting) simultaneously. Every time the signal IN goes through a transition, the pre-driver circuit 126 may initially switch off the active transistors QP/QN in the buffer circuits 128a-128n, and switch on the inactive transistors QP/QN in the buffer circuits 128a-128n after a delay cell time. The switch off then switch on sequence generally reduces driver switching currents that results in a low power design and reduces simultaneous switching output (SSO) power noise.

Figure 4:
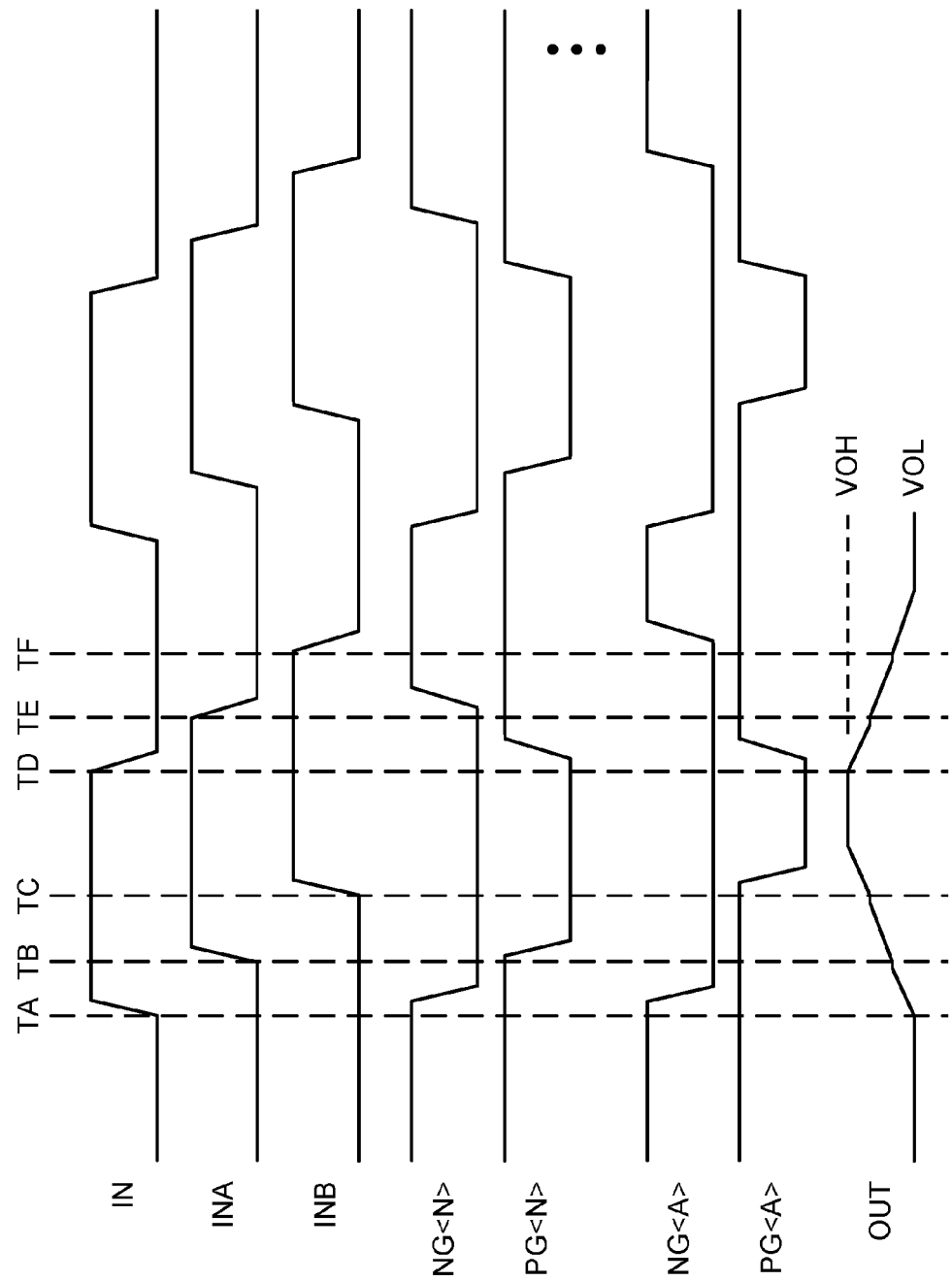
FIG. 4 is a diagram of signal waveforms.

Referring to FIG. 4, a diagram of an example signal waveforms is shown. The diagram generally shows relationships between the signal IN and INA-INN, the gate driver signals PG and NG, and the signal OUT. Rising/falling edges of the gate driver signal groups may be generated from rising/falling edges of the signals IN and INA-INN. For example, if two delay cells 124a-124b are implemented, each gate driver signal PG and NG may have up to nine different waveforms. By generating different groups of the gate driver signals PG and NG, different buffer circuits 128a-128n may be switched on and switched off at each delay edge.

Generally, most to all of the active transistors QP/QN in the buffer circuits 128a-128n may be switched off at each edge of the signal IN. Selective inactive transistors QP/QN in the buffer circuits 128a-128n may be activated on the edges of the signals INA-INN. As such, the slew rate of the signal OUT is generally determined by the delay between the signals IN and INA, the delay between the signals INA and INB, . . . , and the delay between the signals INM and INN. By controlling a sequence of respective delays (or intervals) through the delay cells 124a-124n, a slew rate controllable driver may be realized.

By way of example, starting from an initial condition where the signal IN is in a low state (or voltage), the gate driver signal components NG<A> to NG<N> may be active (high voltage) and the gate driver signal components PG<A> to PG<N> may be inactive (high voltage). The gate driver signals PG and NG may drive the signal OUT to the low state (e.g., VOL)

At a time TA, the signal IN may have a rising edge. The pre-driver circuit 126 generally responds to the rising edge in the signal IN by switching off most to all of the active gate driver signal components NG<A> to NG<N>. In the example, the active buffer circuits 128a-128n are pulling down the signal OUT so the gate driver signal components NG<A> to NG<N> may be switched from active (high voltage) to inactive (low voltage) to switch off (or switch to non-conducting) the respective NMOS pull down transistors QN.

At a time TB, the signal INA may have a rising edge (the same rising edge in the signal IN delayed through the delay cell 124a). The pre-driver circuit 126 may respond to the rising edge in the signal INA by switching off more of the active gate driver signal components NG<A> to NG<N> (if any are still active) that are driving down the signal OUT, and switch on some inactive gate driver signal components PG<A> to PG<N> (e.g., switch on PG<N>) to activate (or switch to conducting) the respective pull up transistors QP. In the example, the gate driver signal PG<N> is switched from inactive (high voltage) to active (low voltage) to switch on a corresponding PMOS pull up transistor QP.

At a time TC, the signal INB may have a rising edge (the same rising edge in the signal INA delayed through the delay cell 124b). The pre-driver circuit 126 may respond to the rising edge in the signal INB by switching off (low voltage) all remaining active gate driver signal components NG<A> to NG<N>, and switch on (low voltage) all remaining inactive gate driver signal components PG<A> to PG<N> (e.g., switch on PG<A>) to switch on the respective pull up transistors QP.

At a time TD, the signal IN may have a falling edge. The pre-driver circuit 126 generally responds to the falling edge in the signal IN by switching off most to all of the active gate driver signal components PG<A> to PG<N>. In the example, the active buffer circuits 128a-128n are pulling up the signal OUT so the gate driver signal components PG<A> to PG<N> may be switched from active (low voltage) to inactive (high voltage) to switch off the respective pull up transistors QP.

At a time TE, the signal INA may have a falling edge (the same falling edge in the signal IN delayed through the delay cell 124a). The pre-driver circuit 126 may respond to the falling edge in the signal INA by switching off more of the active gate driver signal components PG<A> to PG<N> (if any are still active) that are driving up the signal OUT, and switch on some inactive gate driver signal components NG<A> to NG<N> (e.g., switch on NG<N>) to switch on the respective pull down transistors QN. In the example, the gate driver signal NG<N> is switched from inactive (low voltage) to active (high voltage) to switch on a corresponding pull down transistor QN.

At a time TF, the signal INB may have a falling edge (the same falling edge in the signal INA delayed through the delay cell 124b). The pre-driver circuit 126 may respond to the falling edge in the signal INB by switching off (high voltage) all remaining active gate driver signal components PG<A> to PG<N>, and switch on (high voltage) all remaining inactive gate driver signal components NG<A> to NG<N> (e.g., switch on NG<A>) to switch on the respective pull down transistors QN. After the time TF, the signal OUT may be held at a low voltage by the active transistors QN in the buffer circuits 128a-128n.

The number of gate driver signals PG and NG switched at each edge of the signals IN and INA-INN may be fixed for different slew rate settings. An example slew rate setting for 24 buffer circuits 128a-128n is generally illustrated in Table I as follows:

TABLE I

|  | IN Edges | INA Edges | INB Edges |
| --- | --- | --- | --- |
| Switch to active | 0 | 4 | 20 |
| Switch to inactive | 20 | 2 | 2 |

At an edge of the signal IN (e.g., at the time TA or TD), the pre-driver circuit 126 may switch none of the inactive gate driver signals NG/PG from inactive (off) to active (on) and 20 of the 24 (e.g., a majority) of the active gate driver signals PG/NG may be switched from active (on) to inactive (off). With few active gate driver signals PG/NG, the signal OUT may be pulled toward VDD/2 by the termination resistor RT. When the edge appears in the signal INA (e.g., at the time TB or TE), the pre-driver circuit 126 may switch four of the inactive gate driver signals NG/PG to active, and switch two of the remaining four active gate driver signals PG/NG to inactive. The output driver circuit 122 may have two transistors QP/QN pulling the signal OUT one way, and four transistors QN/QP pulling the signal OUT the other way. At an edge in the signal INB (e.g., at the time TC or TF), the pre-driver circuit 126 may switch the remaining gate driver signals so that the signal OUT is being pulled toward only one of the power supply voltage or ground.

Another example slew rate setting for the 24 buffer circuits 128a-128n is generally illustrated in Table II as follows:

TABLE II

|  | IN Edges | INA Edges | INB Edges |
|---|---|---|---|
| Switch PG to active | 0 | 2 | 22 |
| Switch NG to inactive | 20 | 2 | 2 |

At an edge in the signal IN (e.g., the time TA), 20 of the 24 active gate driver signals NG may be switched to inactive (e.g., 4 transistors QN are on and all 24 transistors QP are off). At the edge in the signal INA (e.g., the time TB), two additional active gate driver signals NG may be switched to inactive and two of the inactive gate driver signals PG may be switched to active (e.g., 2 transistors QN are on and 2 transistors QP are on). Between the times TB and TC, only two of the buffer circuits 128a-128n may have both transistors QP and QN switched on (conducting) so a low amount of power may be consumed internal to the output driver circuit 122 during the transition. At the edge in the signal INB (e.g., the time TC), all of the gate driver signals NG may be switched to inactive and all of the gate driver signals PG may be switched to active (e.g., zero transistors QN are on and all 24 transistors QP are on) to complete the drive of the signal OUT from low to high. Other tables may be generated and loaded into the pre-driver circuit 126.

For low power applications, the output driver 122 may have only some of the transistors QP and QN active at any given time and/or switch different numbers of the transistors QP and QN between active and inactive at any given time. For example, slew rate settings for the 24 buffer circuits 128a-128n with three delay cells 124a-124c and the signal OUT starting in at the low voltage VOL are generally illustrated in Table III and Table IV as follows:

TABLE III

|  | IN Edges | INA Edges | INB Edges | INC Edges |
|---|---|---|---|---|
| Switch PG to active | 0 | 4 | 4 | 16 |
| Switch NG to inactive | 20 | 2 | 2 | 0 |
| Remaining PG active | 0 | 4 | 8 | 24 |
| Remaining NG active | 4 | 2 | 0 | 0 |
| Total PG and NG active | 4 | 6 | 8 | 24 |

TABLE IV

|  | IN Edges | INA Edges | INB Edges | INC Edges |
|---|---|---|---|---|
| Switch PG to active | 3 | 3 | 3 | 15 |
| Switch NG to inactive | 10 | 12 | 2 | 0 |
| Remaining PG active | 3 | 6 | 9 | 24 |
| Remaining NG active | 14 | 2 | 0 | 0 |
| Total PG and NG active | 17 | 8 | 9 | 24 |

In some embodiments of the low power applications, most of the components in the active signals NG/PG may be switched to inactive in the first few (e.g., 2 to 4) edges in the signals IN and INA-INN. None to a few (e.g., 1 to 6) of the inactive components in the signals PG/NG may be switched to active in the first few edges in the signals IN and INA-INN. In some embodiments, most of the components in the inactive signals PG/NG may be switched to active in the last few (e.g., 2 to 4) edges in the signals INA-INN. During the slew transition, the number of active signals NG/PG switched to inactive may not match the number of inactive signals PG/NG switched to active at one or more of the edges in the signals IN and INA-INN. In some embodiments, a sum of the transistors QP plus QN that are active (e.g., QP+QN<24) during any one or more delays may be less than the number of active transistors QP or QN at an end of the transition (e.g., QP+QN=24). In various embodiments, the output driver 122 may have less than approximately 10 percent of the buffer circuits 128a-128n with both transistors QP and QN conducting at the same time trying to pull the signal OUT to opposite voltage levels VOH and VOL. In various embodiments, more than two buffer circuits 128a-128n may have both transistors QP and QN switched on at the same time. Other percentages may be implemented to meet the design criteria of a particular application.

Figure 5:
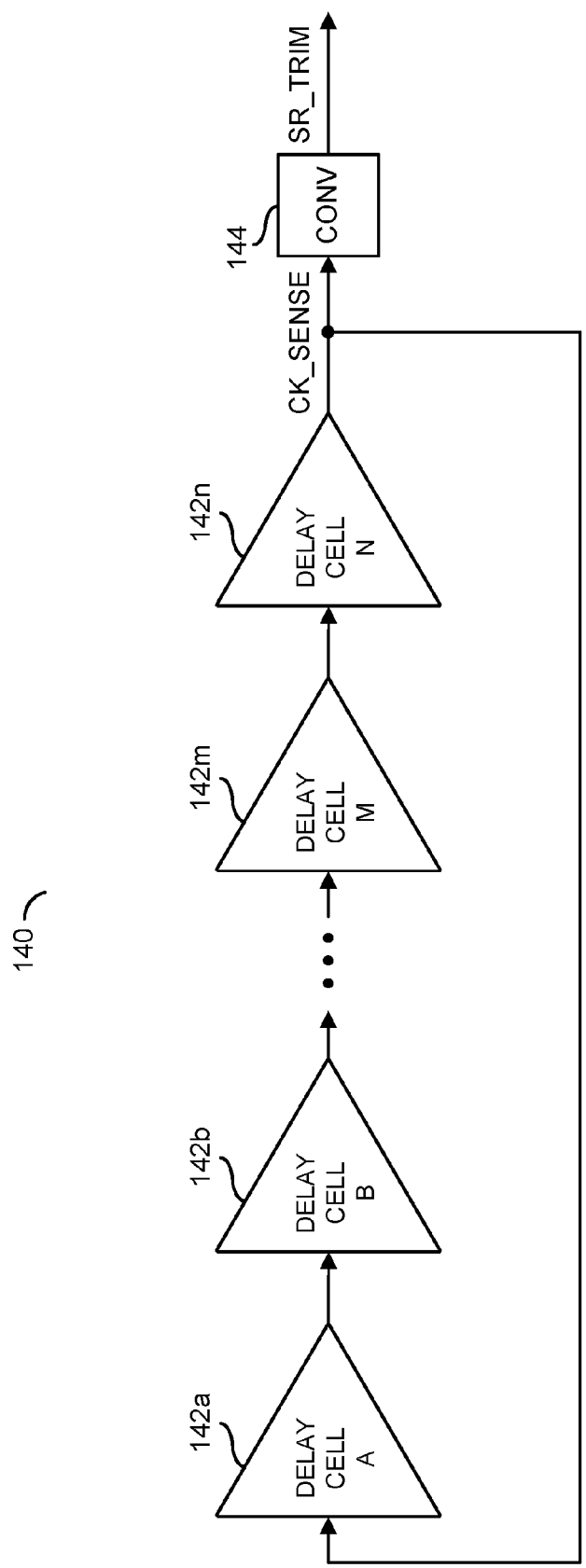
FIG. 5 is a block diagram of an example implementation of a trimming block.

Referring to FIG. 5, a block diagram of an example implementation of a trimming block (or circuit) 140 is shown. The trimming block 140 may be implemented in the RCD circuit 100. The trimming circuit 140 generally comprises multiple delay cell blocks (or circuits) 142a-142n and a conversion block (or circuit) 144. The delay cells 142a-142n may have an odd number of cells arranged as a ring oscillator.

A given delay cell (e.g., 142n) may generate a signal (e.g., CK_SENSE). The signal CK_SENSE may have a sensed frequency that is dependent on one or more fabrication parameters of the integrated circuit (e.g., the RCD circuit 100) on which the trimming circuit 140 was formed. The signal CK_SENSE may be received by the conversion circuit 144. A trim signal (e.g., SR_TRIM) may be generated by the conversion circuit 144. The trim signal SR_TRIM may be used for selecting among different sets of slew rate settings. The trimming operation of the circuit 140 generally makes the slew rate in the signal OUT insensitive to a fabrication process of the RCD circuit 100.

Figure 6:
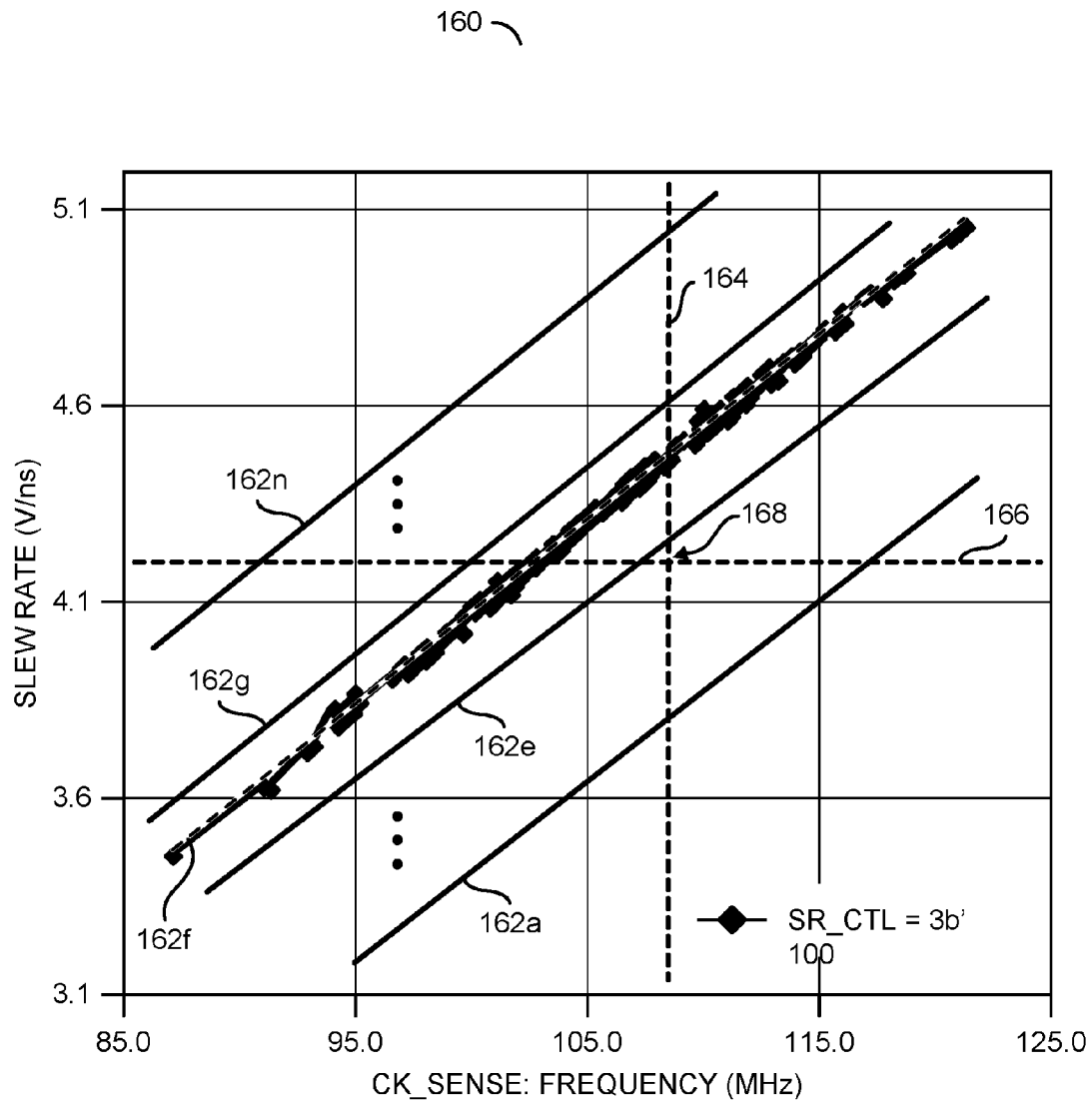
FIG. 6 is a graph of a relationship between a ring oscillator frequency and a slew rate.

Referring to FIG. 6, a graph 160 of an example relationship between the ring oscillator frequency and the slew rate is shown. The x-axis generally illustrates the frequency in the signal CK_SENSE. The y-axis may show the related slew rate. Lines 162a-162n in the graph 160 may illustrate different slew rate settings available for the signal SR_TRIM.

The slew rate value may be linearly proportional to the oscillator frequency. A slew rate value of each setting in the signal SR_TRIM may be deduced from the frequency value. The higher the frequency, the more current that the transistors QP and QN are presenting to/from the termination resistor RT while switched on. To offset the increased current, the slew rate setting in the signal SR_TRIM may be reduced as the oscillator frequency increases. When trimming the slew rate, a frequency of the signal CK_SENSE may be measured. A setting in the signal SR_TRIM may be chosen based on the frequency so that the resulting driver slew rate value is close to a target slew rate value.

In various embodiments, the signal SR_TRIM may convey one among several different slew rates for customization (e.g., lines 162a-162n). A low slew rate setting is generally illustrated by the line 162a. A high slew rate setting may be illustrated by the line 162n.

A vertical line 164 at a measured frequency in the signal CK_SENSE (e.g., a value alone the x-axis) may intersect a horizontal line 166 at a target slew rate intended for a particular application (e.g., a value along the y-axis). The intersecting lines 164 and 166 may establish a target point 168. A slew rate set corresponding to the line 162a-162n closest to the target point 168 (e.g., the line 162e) may be selected to trim the slew rate of the output driver circuit 122.

Figure 7:
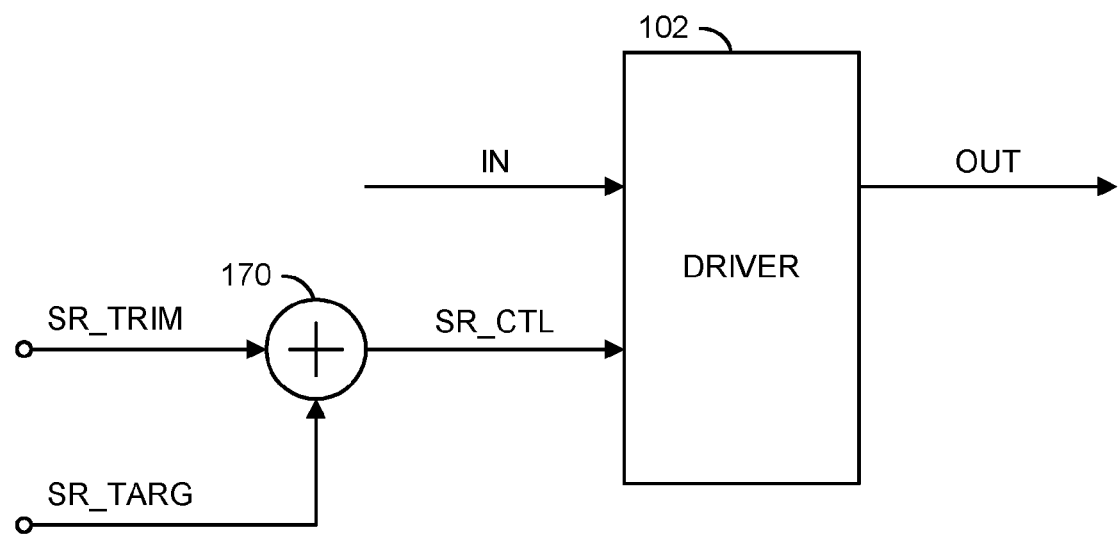
FIG. 7 is a block diagram of an addition block.

Referring to FIG. 7, a block diagram of an example implementation of an addition block (or circuit) 170 is shown. The addition circuit 170 may be implemented in the RCD circuit 100. The addition (or adder) circuit 170 may be operational to add the trim value received in the signal SR_TRIM to an offset value received in a target signal (e.g., SR_TARGET). The sum may be the target slew rate in the control signal SR_CTL. The control signal SR_CTL may subsequently be presented to the driver circuit 102. The offset value in the signal SR_TARGET may be generated by circuitry in the RCD circuit 100 (e.g., a programmable register). To achieve a good signal integrity performance for different DIMM loading and/or different frequencies, the slew rate of the signal OUT may be tuned to different values after the fabrication process trim operation based on the signal SR_TRIM.

In DDR4 memory interface applications, two kinds of drivers (command/address drivers and clock drivers) generally exist. To achieve a good signal integrity performance, the two kinds of drivers may have different slew rate criteria. While DDR4 specifies that the signals CMD'/ADD' match with the clock signal CLK', driver delay may be keep unchanged with different slew rates. Therefore, different slew rate values may be chosen for the driver based on the different DIMM loads.

Figure 8:
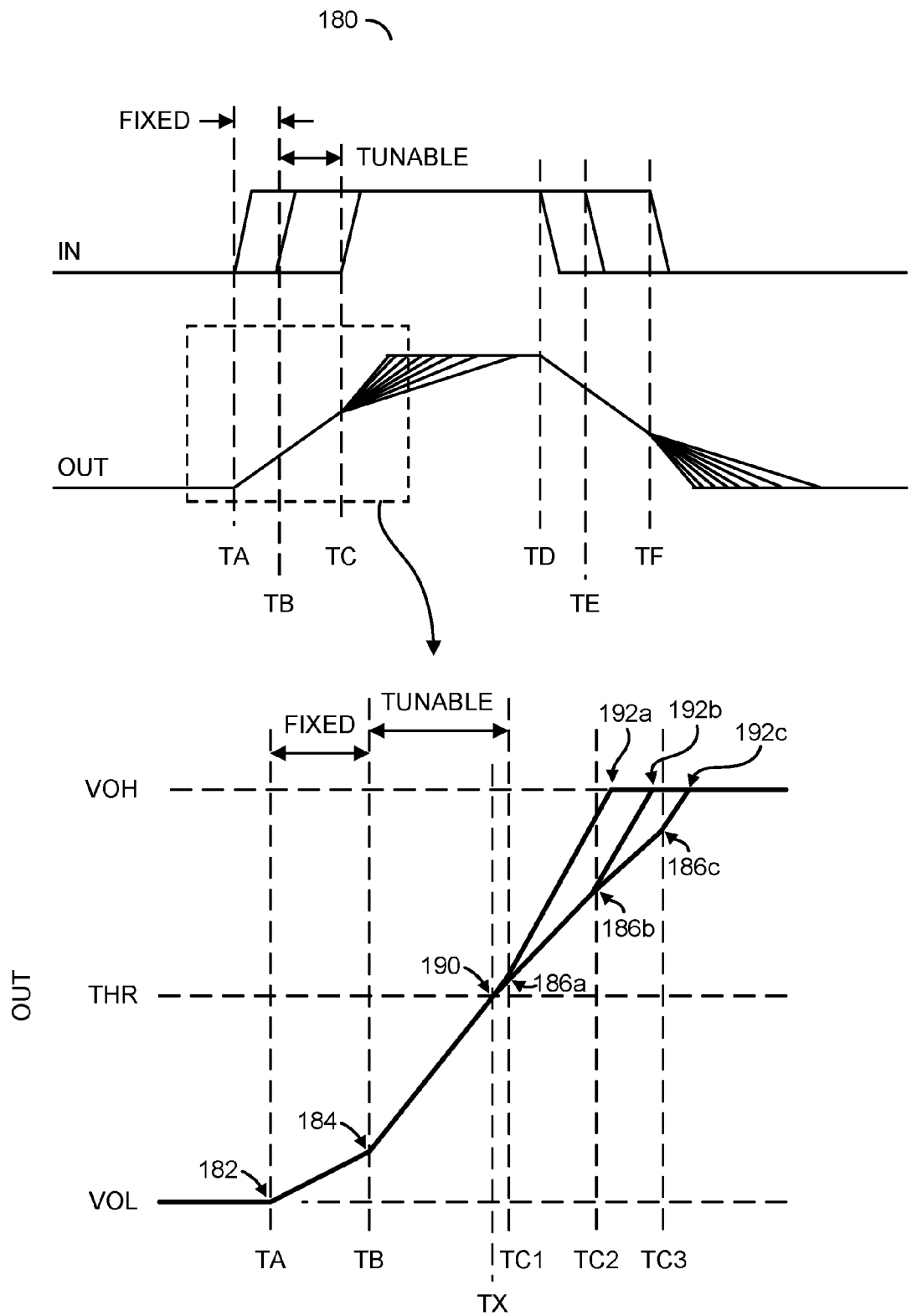
FIG. 8 is a graph of signal waveforms for a command/address implementation of the drive circuit.

Referring to FIG. 8, a graph 180 of example signal waveforms for a command/address implementation of the driver circuit 102 is shown. In the command/address implementation, a delay (or interval) between the times TA and TB, and between the times TD and TE (e.g., the delay through the delay cell 124a) may have a fixed value. A delay (or interval) between the times TB and TC, and between the times TE and TF (e.g., the delay through the delay cell 124b) may have a tunable (or programmable) value to realize different slew rates.

Most of the active buffer circuits 128a-128n may be switched off at the edges in the signals IN (e.g., the times TA or TD). A number of the inactive buffer circuits 128a-128n switched on at the edge in the signal INA (e.g., the times TB or TE) may be chosen so that signal OUT is charged/discharged across a threshold voltage (e.g., THR) before the edge in the signal INB (e.g., the times TC or TF). Slew rate control of the driver is generally realized by keeping the slew rate of the signal OUT at a constant rate until the signal OUT crosses the threshold voltage THR, and tuning the slew rate after the signal OUT has crossed the threshold voltage THR. Different slew rates may be realized with the same driver delay.

A lower half of the graph 180 generally illustrates an expanded portion of the signal OUT around the times TA to TC. At the time TA (e.g., a rising edge in the signal IN), the signal OUT may begin rising from a low voltage (e.g., VOL) starting at a point 182. At the time TB (e.g., a rising edge in the signal INA), the signal OUT may rise at a different (e.g., faster) rate starting at a point 184. Depending on the tuning of the delay through the delay cell 124b, the signal INB may rise somewhere in a range of times TC1 to TC3. If the delay through the delay cell 124b is short, the slew rate of the signal OUT may change starting at a point 186a. If the delay through the delay cell 124b is intermediate, the slew rate of the signal OUT may change starting at a point 186b. If the delay through the delay cell 124b is long, the slew rate of the signal OUT may change starting at a point 186c. The signal OUT may cross a threshold voltage (e.g., THR) that is half way between the low voltage VOL and a high output voltage VOH (THR=(VOH−VOL)/2) at a point 190. In various embodiments, the delay from a change in the signal IN until the signal OUT crosses the threshold voltage THR may be a fixed duration. Depending on the delay in the delay cell 124b, the signal OUT may reach the high voltage VOH in a range of points 192a-192c.

Figure 9:
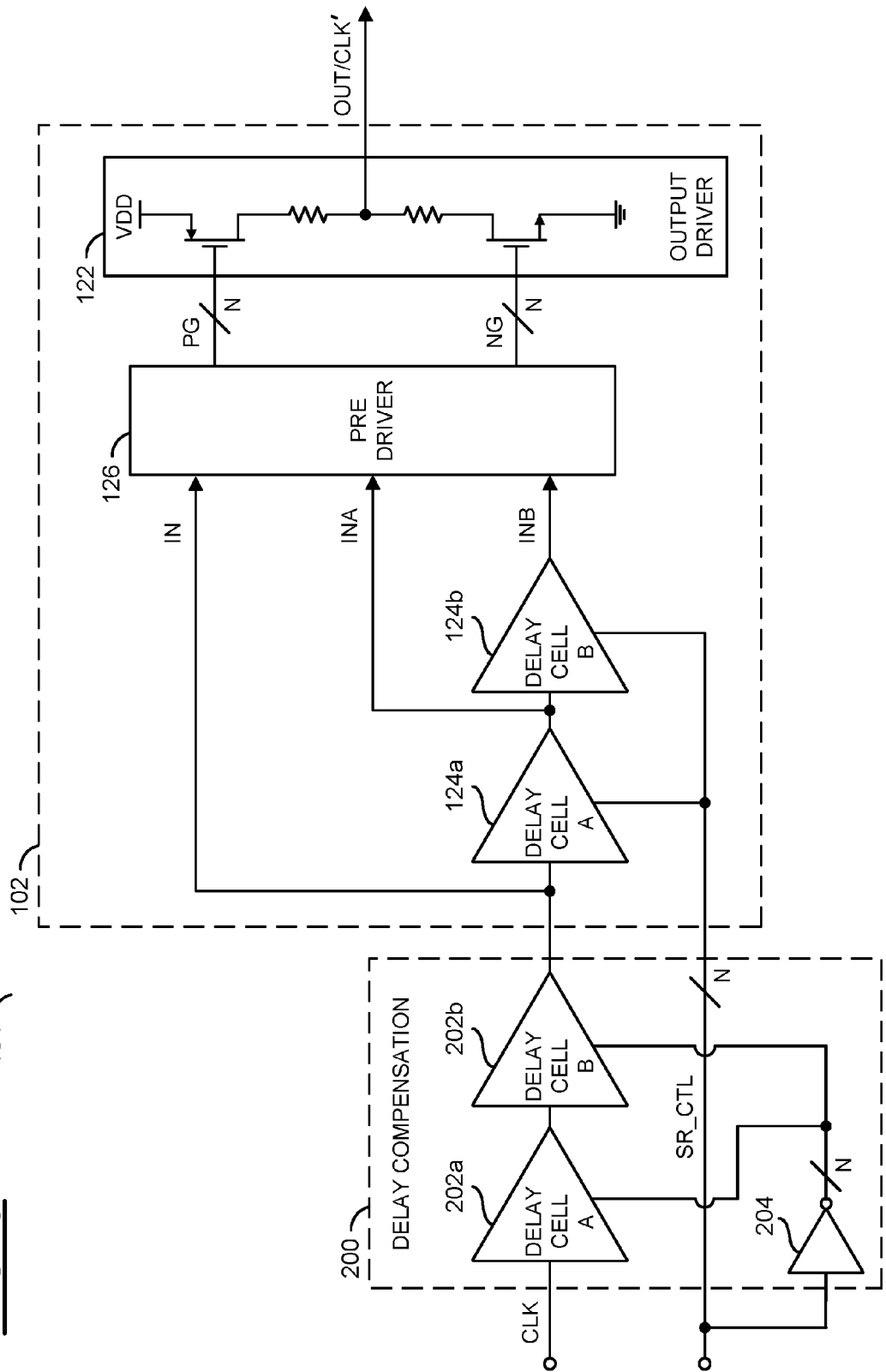
FIG. 9 is a block diagram of a clock driver circuit.

Referring to FIG. 9, a block diagram of an example clock driver circuit 104 implementation is shown. The clock driver circuit 104 may be implemented in the RCD circuit 100. The clock driver circuit 104 generally comprises the driver circuit 102 and a delay compensation block (or circuit) 200. The driver circuit 102 may have two delay cells 124a-124b. The delay compensation circuit 200 generally comprises multiple delay cells 202a-202b and an inverter block (or circuit) 204. The inverter circuit 204 may be used to invert the control signal SR_CTL. The inverted control signal may be received by the delay cells 202a-202b. The control signal SR_CTL may be received by the delay cells 124a-124b. The signal CLK may be received by the delay compensation circuit 200. The signal IN may be generated by the delay compensation circuit 200 and received by the driver circuit 102. The signal. OUT generated by the driver circuit 102 may be the signal CLK'.

The delay of both delay cells 124a-124b may be tunable so that the slew rates before and after the threshold voltage THR are both controlled by the signal SR_CTL. The delay cells 202a-202b may be controlled by the inversion of the signal SR_CTL. The delay cells 202a-202b are generally connected in series to compensate for delay variations at the different slew rates. After the compensation, an overall driver delay from the signal CLK to the signal CLK' may be insensitive to the different slew rate setting in the control signal SR_CLK.

For example, in situations where a slow slew rate is commanded in the signal SR_CTL, the delay cells 202a-202b may have a short delay. An initial combination of the short delay through the delay cells 202a-202b and the long delay through the delay cells 124a-124b may have a known duration. As the commanded slew rate is increased, the delay through the delay circuits 202a-202b is lengthened while the delay through the delay circuits 124a-124b is shortened. The fast commanded slew rate may have a similar total delay as the slow commanded slew rate. At the fast commanded slew rate, a short delay may be programmed into the delay cells 124a-124b, and a long delay may be programmed into the delay cells 202a-202b such that the total delay remains at approximately the known duration.

Figure 10:
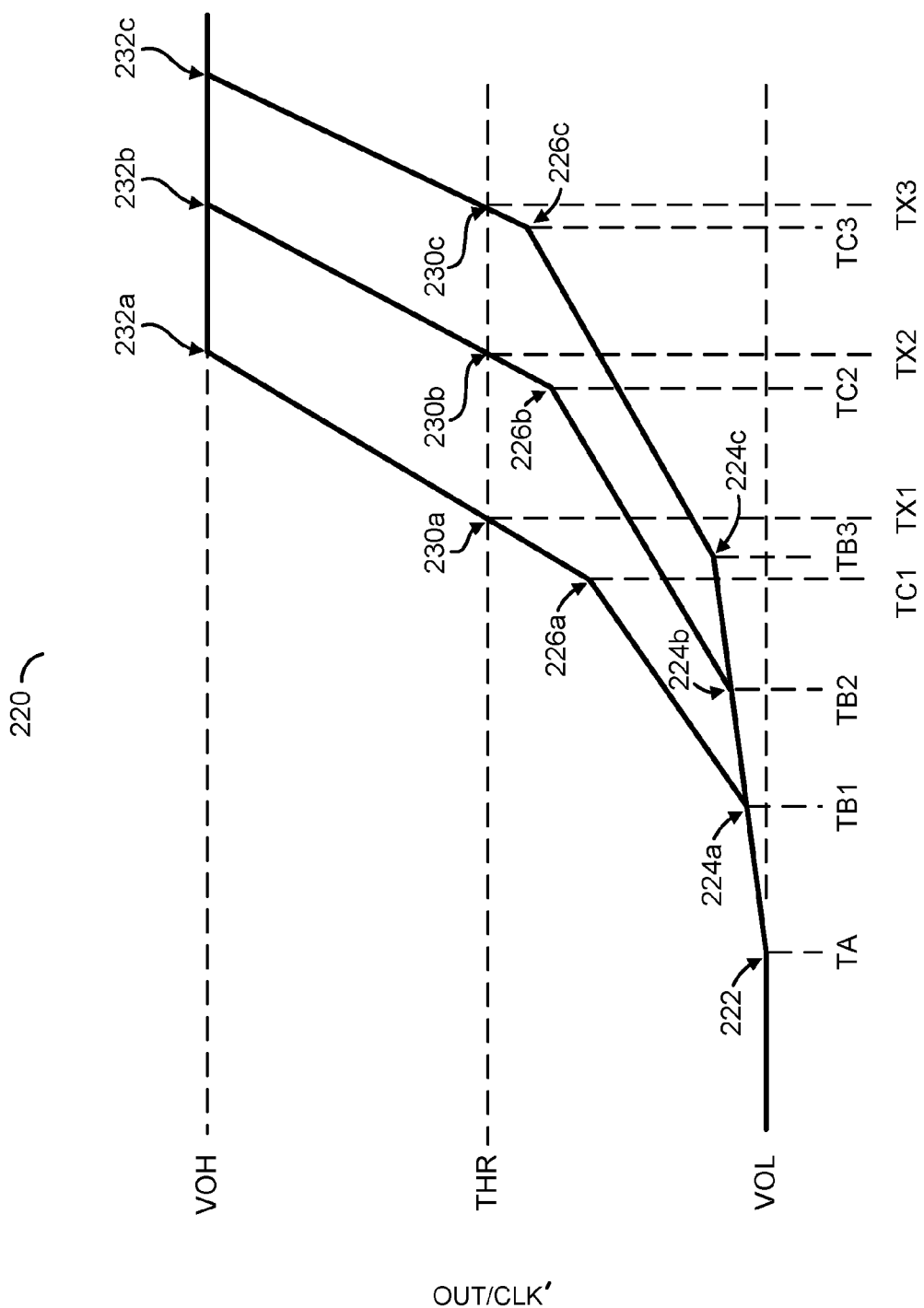
FIG. 10 is a graph of an output signal relative to an input signal when each delay is tunable.

Referring to FIG. 10, a graph 220 illustrating an example portion of the signal OUT/CLK' relative to the signal IN when each delay circuit 124a-124b is tunable is shown. At the time TA, the signal CLK may rise and so the signal OUT/CLK' may begin to rise from the low voltage VOL at a point 222. The delay through the delay cell 124a may be variable from the time TA to a later time in a range from TB1 to TB3. If the delay is short, the slew rate of the signal OUT/CLK' may change at a different rate (e.g., faster) starting at a point 224a. If the delay is long, the slew rate of the signal OUT/CLK' may change starting at a point 224c. An intermediate delay may change the slew rate of the signal OUT/CLK' at a point 224b.

The delay through the delay cell 124b may vary (e.g., from TB1 to TC1, TB2 to TB2 or TB3 to TC3), depending on the control signal SR_CTL. At the end of the second delay (e.g., points 226a, 226b or 226c), the slew rate of the signal OUT/CLK' may change (e.g., increase or decrease) until the high output voltage VOH is achieved at the points 232a, 232b or 232c, respectively. The signal OUT/CLK' may cross the threshold voltage THR at times TX1, TX2 or TX3 (e.g., points 230a, 230b or 230c), based on the actual programmed delays. The delay compensation circuit 200 may be inserted between the signal CLK and the signal IN to bring the times TX1-TX3 together as a single time.

Figure 11:
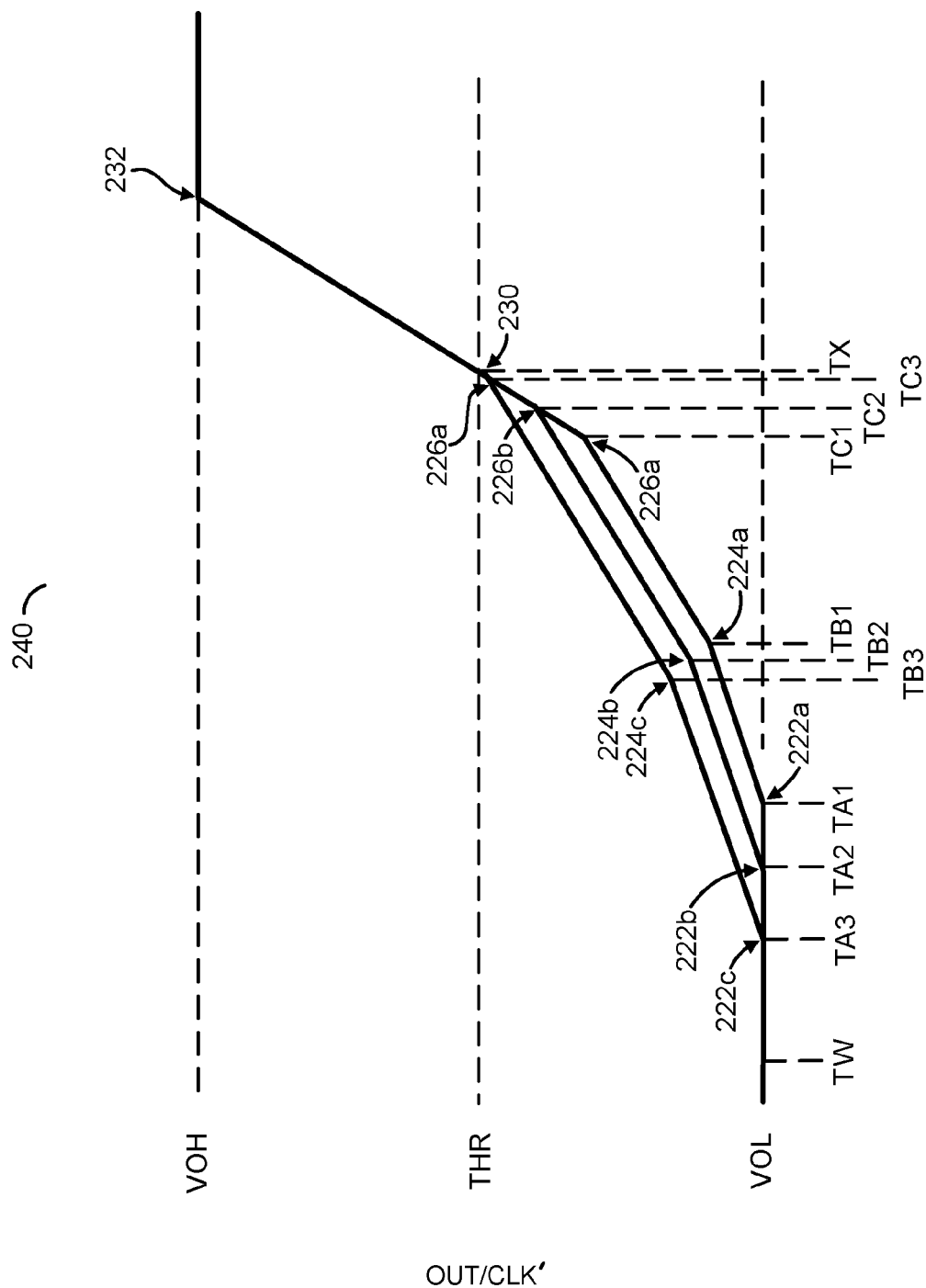
FIG. 11 is a graph of signal waveforms for a clock implementation of the drive circuit.

Referring to FIG. 11, a graph 240 of example signal waveforms for the clock driver circuit 104 is shown. In the clock driver implementation, a delay (or interval) between an edge in the signal CLK (e.g., a time TW) and the time TX when the signal OUT/CLK' crosses the threshold voltage THR may be a fixed value. To account for the different programmable delays in the delay cells 124a-124b, the delay compensation circuit 200 may produce offsetting programmable delays in the delay cells 202a-202b. The variable delays through the delay cells 202a-202b may compensate for the variable delays in the delay cells 124a-124b. The compensation generally merges the points 230a-230c in FIG. 10 into a single point 230 in FIG. 11 where the signal OUT/CLK' crosses the threshold voltage THR. Likewise, the points 230a-230c in FIG. 10 may be merged into a single point 230 in FIG. 11 where the signal OUT/CLK' reaches the high output voltage VOH. The merger of the points 230a-230c and the points 232a-232c may be achieved by dividing the point 222 in FIG. 10 into multiple points 222a-222c in FIG. 11.

As illustrated in the figure, a programmed delay from the time TA1 to the time TB1 and from the time TB1 to the time TC1 may be short. The delay compensation circuit 200 generally accounts for the short delays by programming a long delay (e.g., the time TW to the time TA1) into the delay cells 202a-202b. For intermediate delays from the time TA2 to the time TB2 and from the time TB2 to the time TC2, the delay compensation circuit 200 may provide an intermediate delay (e.g., TX to TA2). For long delays from the time TA3 to the time TB3 and from the time TB3 to the time TC3, the delay compensation circuit 200 may provide a short delay (e.g., TX to TA3). As such, the slew rate of the signal OUT/CLK' may be adjusted while maintaining a constant TW-to-TX delay thought the clock driver circuit 104.

The functions and structures illustrated in the diagrams of FIGS. 1 to 11 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

While FIGS. 3 and 9 show the circuits 102 and 104 in the context of the RCD circuit 100 while transmitting information, copies of the circuits 102 and/or 104 may be implemented at other locations, other data paths, other control paths and/or other clock paths. In some embodiments, copies of the circuits 102 and/or 104 may be located in the data buffer circuits 90a-90n to improve the signals transferred to the memory controller 20 during read cycles. In various embodiments, copies of the circuits 102 and/or 104 may be located on the mother board side of the data bus 30 to improve various signals generated by the memory controller 20 and received by the memory modules 50a-50n. For example, the memory controller 20 may include copies of the circuits 102 and/or 104 to generate the write data sent in the signals DQa-DQn to the memory modules 50a-50n during a write cycle. Instances of the circuits 102 and/or 104 may also be implemented in other circuitry within the memory modules 50a-50n.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:
1. An apparatus comprising:
a first circuit configured to (i) generate a plurality of delayed signals each as a copy of an input signal shifted in time by a sequence of respective delays based on a control signal and (ii) change a number of driver signals that are active during each delay in said sequence of respective delays based on said input signal and said plurality of delayed signals to control a slew rate of an output signal; and
a second circuit configured to drive said output signal in response to said driver signals, wherein (i) an initial delay in said sequence of respective delays has a fixed duration that maintains said slew rate of said output signal at a constant rate until said output signal crosses a threshold voltage and (ii) at least one subsequent delay after said initial delay in said sequence of respective delays has a programmable duration that adjusts said slew rate of said output signal after said output signal has crossed said threshold voltage.

2. The apparatus according to claim 1, wherein said first circuit comprises (i) a plurality of delay cells connected in series and configured to generate said plurality of delayed signals and (ii) a pre-driver circuit configured to (a) receive all of said input signal and said delayed signals and (b) generate said driver signals based on all of said input signal and said delayed signals.

3. The apparatus according to claim 1, wherein said first circuit is further configured to (i) deactivate a first majority of said driver signals that are active within a first few delays at a beginning of said sequence of respective delays, (ii) activate none to a few of said driver signals that are inactive within said first few delays at said beginning of said sequence of respective delays, and (iii) activate a second majority of said driver signals that are inactive within a second few delays at an end of said sequence of respective delays.

4. The apparatus according to claim 1, wherein (i) a first number of driver signals that are activated is different than a second number of said driver signals that deactivated in one or more first delays in said sequence of respective delays and (ii) a third number of said driver signals that are active during one or more second delays in said sequence of respective delays is less than a total number of said driver signals.

5. The apparatus according to claim 1, wherein said first circuit is further configured to have at most ten percent of said driver signals active to drive said output signal to opposite voltage levels concurrently during said sequence of respective delays.

6. The apparatus according to claim 1, wherein said input signal is an address signal or a command signal received by a command/address bus of a double data rate (DDR) memory module.

7. The apparatus according to claim 6, wherein said DDR memory module comprises a double data rate fourth generation (DDR4) dual in-line memory module (DIMM).

8. The apparatus according to claim 1, wherein (i) each delay in said sequence of respective delays except said initial delay has a first programmable duration controlled by said control signal over a range of durations and (ii) said apparatus further comprises a third circuit configured to generate said input signal by delaying a clock signal by a second programmable duration.

9. The apparatus according to claim 8, wherein said second programmable duration is inversely related to said first programmable duration to maintain a constant delay from said clock signal said output signal over said range of durations as controlled by said control signal.

10. The apparatus according to claim 8, wherein said third circuit comprises a plurality of delay cells arranged in series.

11. The apparatus according to claim 1, wherein said apparatus implements a registered clock driver (RCD) circuit.

12. The apparatus according to claim 11, wherein said RCD circuit is at least double data rate fourth generation (DDR4) compliant.

13. The apparatus according to claim 1, wherein said output signal addresses a plurality of dynamic random access memory (DRAM) chips.

14. The apparatus according to claim 1, wherein said number of driver signals that are active during each delay in said sequence of respective delays is based on a selected one of three or more slew rate settings.

15. A method for signal driver slew rate control, comprising the steps of:
generating a plurality of delayed signals each as a copy of an input signal shifted in time by a sequence of respective delays based on a control signal;
changing a number of driver signals that are active during each delay in said sequence of respective delays based on said input signal and said plurality of delayed signals to control said slew rate of an output signal; and
driving said output signal in response to said driver signals, wherein (i) an initial delay in said sequence of respective delays has a fixed duration that maintains said slew rate of said output signal at a constant rate until said output signal crosses a threshold voltage and (ii) at least one subsequent delay after said initial delay in said sequence of respective delays has a programmable duration that adjusts said slew rate of said output signal after said output signal has crossed said threshold voltage.

16. An apparatus comprising:
a first circuit configured to (i) generate a trim signal based on a fabrication process parameter of said apparatus and (ii) generate a control signal that determines a slew rate of an output signal based on both said trim signal and a target signal, wherein (a) said target signal provides a programmable offset to said trim signal and (b) said first circuit comprises an adder configured to generate said control signal as a sum of said trim signal and said target signal; and
a second circuit configured to drive said output signal at said slew rate in response to an input signal.

17. The apparatus according to claim 16, wherein said second circuit comprises:
a third circuit configured to (i) generate a plurality of delayed signals each as a copy of said input signal shifted in time by a sequence of respective delays based on said control signal, and (ii) change a number of driver signals that are active during each delay in said sequence of respective delays based on said input signal and said plurality of delayed signals to control said slew rate of said output signal; and
a fourth circuit configured to drive said output signal in response to said driver signals.

18. The apparatus according to claim 16, wherein (i) said first circuit is further configured to generate a sense frequency indicative of said fabrication process parameter and (ii) said trim signal is one of a plurality of slew rate settings selected in response to said sense frequency.

* * * * *